United States Patent
Zheng et al.

(10) Patent No.: US 10,665,618 B2
(45) Date of Patent: May 26, 2020

(54) DISPLAY PANEL AND DISPLAY DEVICE

(71) Applicant: Wuhan China Star Optoelectronics Technology Co., Ltd., Wuhan, Hubei (CN)

(72) Inventors: Zike Zheng, Hubei (CN); Lulu Xie, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 36 days.

(21) Appl. No.: 16/152,646

(22) Filed: Oct. 5, 2018

(65) Prior Publication Data

US 2019/0305001 A1    Oct. 3, 2019

Related U.S. Application Data

(63) Continuation of application No. PCT/CN2018/095692, filed on Jul. 13, 2018.

(30) Foreign Application Priority Data

Mar. 29, 2018   (CN) .......................... 2018 1 0271688

(51) Int. Cl.
    *G02F 1/1345*   (2006.01)
    *H01L 27/12*    (2006.01)
    *G09G 3/20*     (2006.01)

(52) U.S. Cl.
    CPC ........ *H01L 27/124* (2013.01); *H01L 27/1218* (2013.01); *G09G 3/20* (2013.01); *G09G 2300/0408* (2013.01)

(58) Field of Classification Search
    CPC ............. G02F 1/33308; G02F 1/13454; G02F 1/13452; H01L 27/3244; H01L 2924/426
    USPC .......................................... 349/56, 150, 152
    See application file for complete search history.

(56) References Cited

U.S. PATENT DOCUMENTS

| | | | |
|---|---|---|---|
| 10,001,664 B2 * | 6/2018 | Mitani | ............. G02F 1/133305 |
| 2015/0194109 A1 * | 7/2015 | Fujikawa | ............ G02F 1/13454 345/100 |
| 2018/0299719 A1 * | 10/2018 | Fujikawa | ............ G02F 1/13454 |
| 2019/0324311 A1 * | 10/2019 | Yuminami | ............ G02F 1/1339 |

FOREIGN PATENT DOCUMENTS

CN        107170366 A    9/2017

* cited by examiner

*Primary Examiner* — S. V. Clark
(74) *Attorney, Agent, or Firm* — Leong C. Lei

(57) ABSTRACT

Provided is a display panel, comprising a substrate, and a display area and a non-display area formed on the substrate; wherein metal traces are disposed on one side of the non-display area to electrically connect an integrated circuit in the non-display area with an external structure integrated with a driver integrated circuit (IC) for driving the integrated circuit in the non-display area by the external structure integrated with the driver IC to illuminate the display area. By bonding the driver IC to the external structure, the area ratio of the bonding area of the driver IC on the display panel is reduced to increase the screen occupation ratio of the display panel.

17 Claims, 3 Drawing Sheets

| 5.5 inches display panel (prior art) | | | 5.5 inches display panel (first embodiment) | | |
|---|---|---|---|---|---|
| area | area (mm²) | screen occupation ratio | area | area (mm²) | screen occupation ratio |
| GOA area | 145.9 | 91% | GOA area | 145.9 | 92.5% |
| IC opposite area | 41.8 | | IC opposite area | 41.8 | |
| driver IC bonding area | 636 | | driver IC bonding area | 381.6 | |
| display area | 8362.7 | | display area | 8499.6 | |
| total | 9186.4 | | total | 9186.4 | |

FIG. 5

DISPLAY PANEL AND DISPLAY DEVICE

CROSS-REFERENCE TO RELATED APPLICATION

This application is a continuing application of PCT Patent Application No. PCT/CN2018/095692 entitled "Display panel and display device", filed on Jul. 13, 2018, which claims priority to Chinese Patent Application No. 201810271688.5, filed on Mar. 29, 2018, both of which are hereby incorporated in its entireties by reference.

FIELD OF THE INVENTION

The present invention relates to a display field, and more particularly to a display panel and a display device.

BACKGROUND OF THE INVENTION

In such information society today, displays have been widely used in all aspects of our lives, for small-sized mobile phones, camcorders, digital cameras, medium-sized notebooks, desktops, large-sized home televisions and large projection devices.

As the desire for the screen occupation ratio of the display panel is higher and higher, the requirement for introducing a narrow frame is also increasing. As shown in FIGS. 1 and 2, the display panel is connected to a flexible circuit board F', which includes a display area 11' and a non-display area 12' distributed around the display area 11'; wherein the non-display area 12' includes an integrated circuit bonding area (such as a GOA bonding area) 121', a driver IC bonding area 122' and an IC opposite side area 123' opposite to the driver IC bonding area 122'. Since the GOA bonding area 121' and the IC opposite side area 123' can no longer be reduced, in order to realize the design requirement of the narrow frame, it is necessary to reduce the area of the driver IC bonding area 122' to increase the screen occupation ratio of the display panel.

SUMMARY OF THE INVENTION

An objective of the present invention is to provide a display panel and a display device, in which by bonding the driver IC to the external structure, the area ratio of the bonding area of the driver IC on the display panel is reduced to increase the screen occupation ratio of the display panel.

For solving the aforesaid technical issues, the embodiment of the present invention provides a display panel, comprising a substrate, and a display area and a non-display area formed on the substrate; wherein metal traces are disposed on one side of the non-display area to electrically connect an integrated circuit in the non-display area with an external structure integrated with a driver integrated circuit (IC) for driving the integrated circuit in the non-display area by the external structure integrated with the driver IC to illuminate the display area.

A width of the non-display area accommodating the metal traces adjacent to the external structure is 3 mm.

An area ratio of the display area to the non-display area is 37:3.

The external structure is bonded to the metal traces of the non-display area which are correspondingly connected thereto.

The integrated circuit in the non-display area is a gate driving circuit.

The external structure is a chip on film (COF) structure.

The substrate is a glass substrate.

Correspondingly, the embodiment of the present invention further provides a display panel, comprising a substrate, and a display area and a non-display area formed on the substrate; wherein metal traces are disposed on one side of the non-display area to electrically connect an integrated circuit in the non-display area with an external structure integrated with a driver integrated circuit (IC) for driving the integrated circuit in the non-display area by the external structure integrated with the driver IC to illuminate the display area;

wherein a width of the non-display area accommodating the metal traces adjacent to the external structure is 3 mm;

the external structure is bonded to the metal traces of the non-display area which are correspondingly connected thereto.

An area ratio of the display area to the non-display area is 37:3.

The integrated circuit in the non-display area is a gate driving circuit.

The external structure integrated with the driver IC is a chip on film (COF) structure.

The substrate is a glass substrate.

Correspondingly, the embodiment of the present invention further provides a display device, comprising a display panel; wherein the display panel comprises a substrate, and a display area and a non-display area formed on the substrate; wherein metal traces are disposed on one side of the non-display area to electrically connect an integrated circuit in the non-display area with an external structure integrated with a driver integrated circuit (IC) for driving the integrated circuit in the non-display area by the external structure integrated with the driver IC to illuminate the display area.

A width of the non-display area accommodating the metal traces adjacent to the external structure is 3 mm.

An area ratio of the display area to the non-display area is 37:3.

The external structure is bonded to the metal traces of the non-display area which are correspondingly connected thereto.

The integrated circuit in the non-display area is a gate driving circuit.

The external structure integrated with the driver IC is a chip on film (COF) structure.

The substrate is a glass substrate.

In conclusion, the embodiment of the present invention possesses the following beneficial result: compared with the conventional display panel, the driver IC of the present invention is integrated into the external structure, and the electrical connection between the integrated circuit in the non-display area of the display panel and the external structure integrated with the driver IC can be electrically connected only by leading out the metal traces to illuminate the display area. Thus, the area occupied by the driver IC on the display panel is reduced to increase the screen occupation ratio of the display panel (i.e., the proportion of the display area).

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

FIG. 5 is a comparison chart of ratios of respective areas as the display panel according to the first embodiment of the present invention and the display panel of the prior art are both 5.5 inches.

DETAILED DESCRIPTION OF PREFERRED EMBODIMENTS

In order to make the objectives, technical solutions, and advantages of the embodiments of the disclosure more apparent, the present invention will be described below in detail with reference to the drawings.

Figure 1:
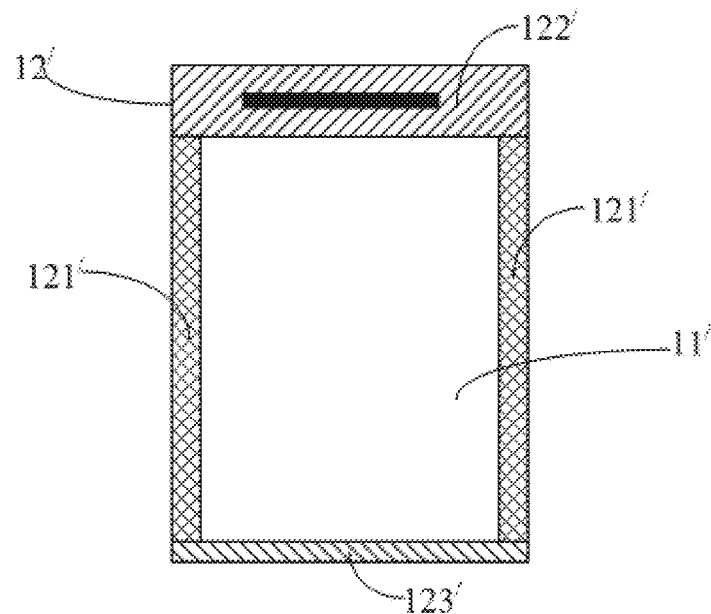
FIG. 1 is a planar structure sectional view diagram of a display panel in the prior art.
Figure 2:
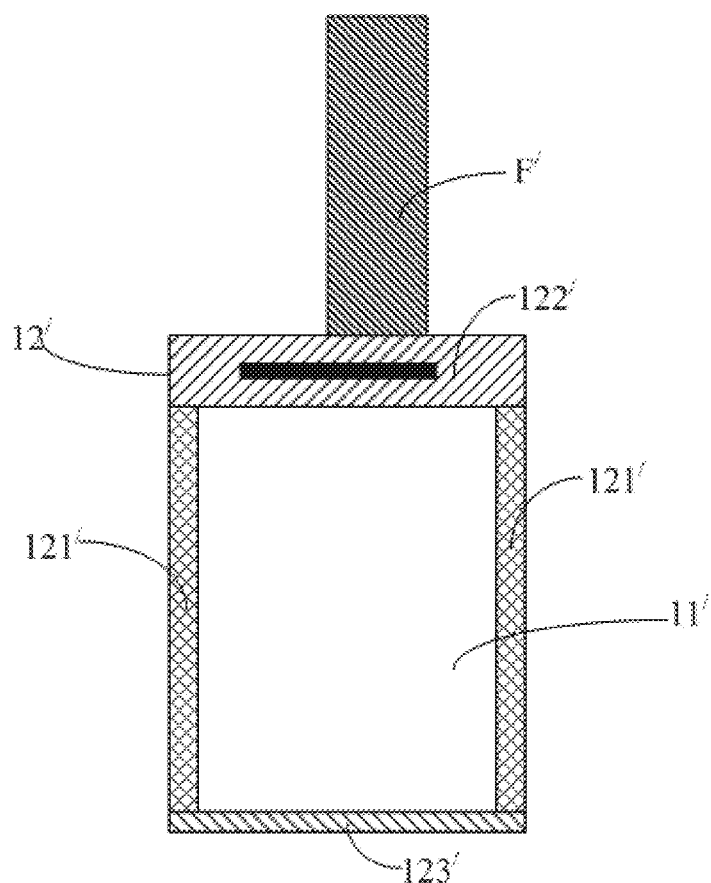
FIG. 2 is a connection sectional view diagram between a display panel and a flexible circuit board in the prior art.
Figure 3:
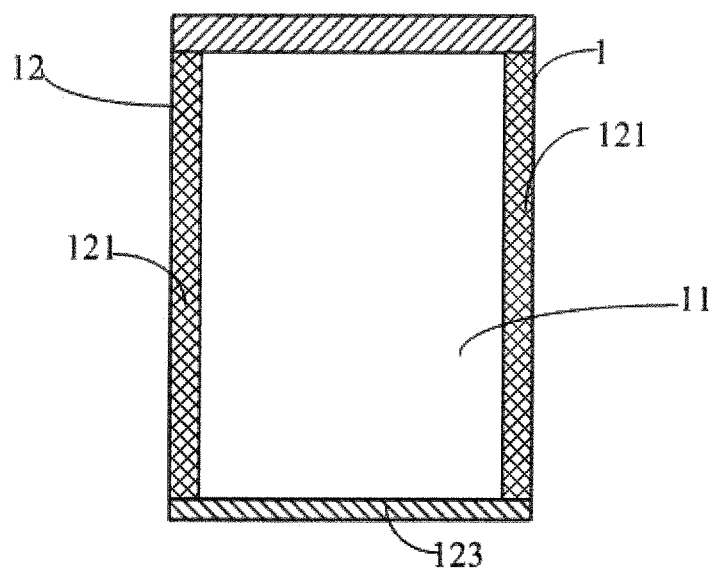
FIG. 3 is a planar structure sectional view diagram of a display panel according to the first embodiment of the present invention.
Figure 4:
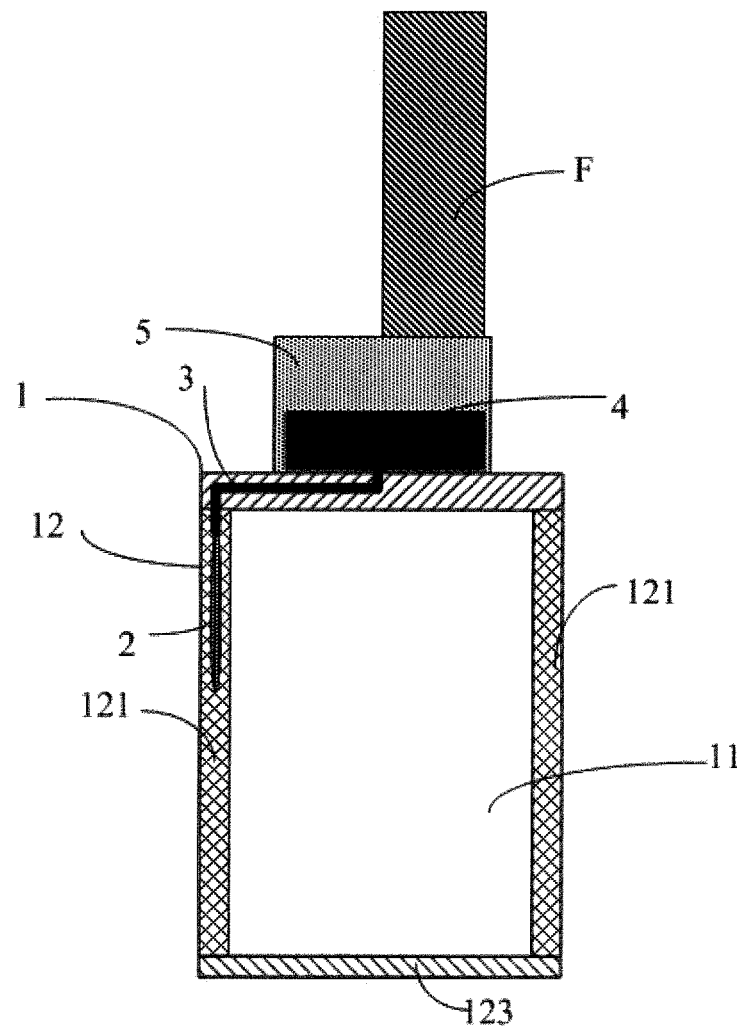
FIG. 4 is a connection sectional view diagram between a display panel and a flexible circuit board according to the first embodiment of the present invention.

As shown in FIG. 3 and FIG. 4, in the first embodiment of the present invention, provided is a display panel, comprising a substrate 1, and a display area 11 and a non-display area 12 formed on the substrate 1; wherein metal traces are disposed on one side of the non-display area 12 to electrically connect an integrated circuit in the non-display area 12 with an external structure 5 integrated with a driver integrated circuit (IC) 2 for driving the integrated circuit in the non-display area 12 by the external structure 5 integrated with the driver IC to illuminate the display area 11.

Specifically, on the conventional display panel, the driver IC and integrated circuit mounted in the non-display area 12 are also connected by the metal traces 3. In the display panel according to the first embodiment of the present invention, the original driver IC is integrated into the external structure D, thus the original occupied area of the driver IC on the display panel for bonding the driver IC can be eliminated, and only the area of the metal traces 3 are required. Accordingly, the saved area for bonding the driver IC is used as a portion of the display area 1, and the display area 11 can be effectively increased, that is, the screen occupation ratio is increased.

In one embodiment, the area originally used for bonding the driver IC is 5 mm from the edge of the display area 11. After the driver IC is bonded to the external structure 5, the area originally used for bonding the driver IC (for the metal traces 3 only) is 3 mm from the edge of the display area 11. Namely, the width of the non-display area 12 accommodating the metal traces 3 adjacent to the external structure 5 is 3 mm.

It can be understood that the non-display area 12 also needs to retain the non-reducible areas, such as the integrated circuit bonding area 121, the IC opposite side area 123, and the like. The substrate 1 includes, but is not limited to, a glass substrate.

In the first embodiment of the present invention, the screen occupation ratio of the display panel is 92.5%, that is, the area occupation ratio of the display area 11 is 92.5%, and the area occupation ratio of the non-display area 12 is 7.5%, and the ratio of the two is 37:3.

In the first embodiment of the present invention, the external structure 5 integrated with the driver IC is bonded to the metal traces 3 of the non-display area 12 which are correspondingly connected thereto, which is beneficial for the process. Specifically, the driver IC comprises a gate signal source IC providing gate signals and a data signal source IC providing data signals.

In the first embodiment of the present invention, the integrated circuit in the non-display area 12 is a gate driving circuit (GOA) for illuminating the display area 11.

In the first embodiment of the present invention, the external structure 5 integrated with the driver IC is a chip on film (COF) structure. Specifically, the side of the chip on film (COF) structure remote from the display panel should be provided with a bonding area for connection with the flexible circuit board F (shown in FIG. 4). The specific COF manner of the external structure 5 integrated with the driver IC is that the driver IC is fixed on the flexible circuit board by the chip on flex technology, and usually an ACF (isotropic conductive film) is used as the medium for bonding.

As shown in FIG. 5, the ratios of respective areas as the display panel according to the first embodiment of the present invention and the display panel of the prior art are both 5.5 inches are shown for comparison. Obviously, the screen occupation ratio 92.5% of the display panel according to the first embodiment of the present invention is larger than the screen occupation ratio 91% of the display panel of the prior art.

Corresponding to the first embodiment of the present invention, the second embodiment of the present invention provides a display device, comprising the display panel in the first embodiment of the present invention, and has the same structure and connection relationship as those of the display panel in the first embodiment of the present invention. For details, refer to the related content in the first embodiment of the present invention, and details are not described herein again.

In conclusion, the implementation of the embodiment of the present invention possesses the following beneficial result: compared with the conventional display panel, the driver IC of the present invention is integrated into the external structure, and the electrical connection between the integrated circuit in the non-display area of the display panel and the external structure integrated with the driver IC can be electrically connected only by leading out the metal traces to illuminate the display area. Thus, the area occupied by the driver IC on the display panel is reduced to increase the screen occupation ratio of the display panel (i.e., the proportion of the display area).

The above content with the specific preferred embodiments of the present invention is further made to the detailed description, the specific embodiments of the present invention should not be considered limited to these descriptions. Those of ordinary skill in the art for the present invention, without departing from the spirit of the present invention, can make various simple deduction or replacement, should be deemed to belong to the scope of the present invention.

What is claimed is:

1. A display panel, comprising a substrate, and a display area and a non-display area formed on the substrate; wherein metal traces are disposed on one side of the non-display area to electrically connect an integrated circuit in the non-display area with an external structure integrated with a driver integrated circuit (IC) for driving the integrated circuit in the non-display area by the external structure integrated with the driver IC to illuminate the display area; wherein a width of the non-display area accommodating the metal traces adjacent to the external structure is 3 mm.

2. The display panel according to claim 1, wherein an area ratio of the display area to the non-display area is 37:3.

3. The display panel according to claim 2, wherein the external structure is bonded to the metal traces of the non-display area which are correspondingly connected thereto.

4. The display panel according to claim 3, wherein the integrated circuit in the non-display area is a gate driving circuit.

5. The display panel according to claim 4, wherein the external structure integrated with the driver IC is a chip on film (COF) structure.

6. The display panel according to claim 5, wherein the substrate is a glass substrate.

7. A display panel, comprising a substrate, and a display area and a non-display area formed on the substrate; wherein metal traces are disposed on one side of the non-display area to electrically connect an integrated circuit in the non-display area with an external structure integrated with a driver integrated circuit (IC) for driving the integrated circuit in the non-display area by the external structure integrated with the driver IC to illuminate the display area;
wherein a width of the non-display area accommodating the metal traces adjacent to the external structure is 3 mm;
the external structure is bonded to the metal traces of the non-display area which are correspondingly connected thereto.

8. The display panel according to claim 7, wherein an area ratio of the display area to the non-display area is 37:3.

9. The display panel according to claim 8, wherein the integrated circuit in the non-display area is a gate driving circuit.

10. The display panel according to claim 9, wherein the external structure integrated with the driver IC is a chip on film (COF) structure.

11. The display panel according to claim 10, wherein the substrate is a glass substrate.

12. A display device, comprising a display panel; wherein the display panel comprises a substrate, and a display area and a non-display area formed on the substrate; wherein metal traces are disposed on one side of the non-display area to electrically connect an integrated circuit in the non-display area with an external structure integrated with a driver integrated circuit (IC) for driving the integrated circuit in the non-display area by the external structure integrated with the driver IC to illuminate the display area; wherein a width of the non-display area accommodating the metal traces adjacent to the external structure is 3 mm.

13. The display device according to claim 12, wherein an area ratio of the display area to the non-display area is 37:3.

14. The display device according to claim 13, wherein the external structure is bonded to the metal traces of the non-display area which are correspondingly connected thereto.

15. The display device according to claim 14, wherein the integrated circuit in the non-display area is a gate driving circuit.

16. The display device according to claim 15, wherein the external structure integrated with the driver IC is a chip on film (COF) structure.

17. The display device according to claim 16, wherein the substrate is a glass substrate.

* * * * *